United States Patent
Lui

(10) Patent No.: US 9,269,805 B2
(45) Date of Patent: Feb. 23, 2016

(54) METHOD TO MANUFACTURE SHORT CHANNEL TRENCH MOSFET

(71) Applicant: Alpha and Omega Semiconductor Incorporated

(72) Inventor: Sik Lui, Sunnyvale, CA (US)

(73) Assignee: Alpha and Omega Semiconductor Incorporated, Sunnyvale, CA (US)

(*) Notice: Subject to any disclaimer, the term of this patent is extended or adjusted under 35 U.S.C. 154(b) by 0 days.

(21) Appl. No.: 14/838,203

(22) Filed: Aug. 27, 2015

(65) Prior Publication Data

US 2015/0372133 A1    Dec. 24, 2015

Related U.S. Application Data

(62) Division of application No. 14/080,164, filed on Nov. 14, 2013, now Pat. No. 9,123,805.

(51) Int. Cl.
| | |
|---|---|
| H01L 21/76 | (2006.01) |
| H01L 29/78 | (2006.01) |
| H01L 29/66 | (2006.01) |
| H01L 29/167 | (2006.01) |
| H01L 21/265 | (2006.01) |
| H01L 29/423 | (2006.01) |
| H01L 21/266 | (2006.01) |
| H01L 29/10 | (2006.01) |

(52) U.S. Cl.
CPC .......... *H01L 29/7813* (2013.01); *H01L 21/266* (2013.01); *H01L 21/26513* (2013.01); *H01L 21/26586* (2013.01); *H01L 29/1095* (2013.01); *H01L 29/167* (2013.01); *H01L 29/4236* (2013.01); *H01L 29/66704* (2013.01); *H01L 29/66734* (2013.01); *H01L 29/7825* (2013.01)

(58) Field of Classification Search
CPC . H01L 21/763; H01L 29/66363; H01L 29/74; G11C 11/412
USPC .................................. 365/180; 257/332, 107
See application file for complete search history.

(56) References Cited

U.S. PATENT DOCUMENTS

| | | | | |
|---|---|---|---|---|
| 7,897,440 | B1* | 3/2011 | Horch ..................... | G11C 11/39 257/107 |
| 9,123,805 | B2* | 9/2015 | Lui ....................... | H01L 29/7827 |
| 2003/0214011 | A1* | 11/2003 | Jianjun ................ | H01L 29/1095 257/500 |
| 2008/0012068 | A1* | 1/2008 | Lee .................... | H01L 21/26513 257/330 |
| 2011/0193177 | A1* | 8/2011 | Loechelt ............. | H01L 29/7835 257/402 |
| 2011/0284950 | A1* | 11/2011 | Henson ............... | H01L 29/0878 257/330 |

* cited by examiner

*Primary Examiner* — Caridad Everhart
(74) *Attorney, Agent, or Firm* — Joshua D. Isenberg; JDI Patent

(57) ABSTRACT

Aspects of the present disclosure describe a trench MOSFET with a channel length that may be controlled by counterdoping the body-drain junction to form a straggle region adjacent to the trenches. The channel length is defined between the straggle region at the bottom and a source region at the top. Both of the straggle region and the source region are of the same conductivity type though they may be different ion species. It is emphasized that this abstract is provided to comply with rules requiring an abstract that will allow a searcher or other reader to quickly ascertain the subject matter of the technical disclosure. It is submitted with the understanding that it will not be used to interpret or limit the scope or meaning of the claims.

20 Claims, 8 Drawing Sheets ved to the drain below the body region 106B. The

METHOD TO MANUFACTURE SHORT CHANNEL TRENCH MOSFET

CLAIM OF PRIORITY

This application is a continuation of commonly-assigned, co-pending application Ser. No. 14/080,164, filed Nov. 14, 2013, the entire disclosures of which are incorporated herein by reference.

FIELD OF THE DISCLOSURE

This disclosure generally relates to semiconductor devices. More particularly, this disclosure relates to device structures for short channel trench MOSFETs and methods for manufacturing thereof.

BACKGROUND OF THE INVENTION

Metal oxide semiconductor field effect transistors (MOSFETs) are transistors used in a variety of electronic devices and systems for switching, amplification, filtering, and other tasks related to both analog and digital electrical signals. MOSFETs formed on n-type or p-type semiconductor material include a channel through which current flows. The length of the channel is one of the most important parameters, which determines the performance of the MOSFET as measured by the speed of operation and the on resistance of the device. Two widely-used types of power MOSFETs are planar MOSFETs and trench MOSFETs.

FIG. 1A is a cross sectional view of a conventional planar power DMOSFET transistor. The planar DMOSFET transistor 100A includes a gate structure or stack 102A formed on a semiconductor substrate of a first conductivity type 101A, which also serves as the drain of the transistor. The gate stack 102A generally includes a thin gate dielectric layer 103A overlying the substrate 101A and a gate electrode situated over the gate dielectric layer. Source regions 104A and 105A of the first conductivity type are formed in a body region 106A of an opposite conductivity type in the substrate 101A on either side of the gate structure 102A, thereby defining a channel region 107A at the upper surface of the substrate under the gate structure. In operation, the gate electrode is biased to create an electric field to invert the channel underneath the gate dielectric layer and allowing carriers to travel through the channel between the source and drain regions.

The channel length of a planar MOSFET is typically controlled by implantation and diffusion from the edge of the gate stack. Specifically, the gate electrode on the substrate with a thin gate dielectric layer defines an edge from which implantation and diffusion are performed to form a body region. The following source implant and diffusion are also processed from the same gate electrode edge. The channel length is determined according to implant energy and thermal cycles of the body and source diffusions. It thus provides a tighter process control and ease of manufacturing.

In the planar power MOSFET structure as shown in FIG. 1A, the carriers from the source have to pass through a region between the two body regions before they reaches the drain region (101A). The depletion regions between the bodies and the drain reduce the conductance of the current path thus increase the on-resistance of the device. It is due to this JFET effect that limits the scaling for the planar power MOSFET.

Compared to planar power MOSFETs, trench power MOSFETs have higher cell density. FIG. 1B is a cross sectional view showing a conventional trench MOSFET. The trench MOSFET 100B includes a plurality of trenches 102B formed in a substrate 101B, which also serves as the drain region of the transistor. The vertical sidewalls and the bottom of the trenches are lined with a layer of gate insulation 103B. Each trench 102B is at least partially filled with electrically conductive gate electrode material 108B, such as doped polysilicon. The trench MOSFET 100B also includes a body region of the second conductivity type 106B formed in the substrate 101B, and source region 105B formed above the body region 106B. A drain contact 104B is provided at the bottom of the substrate. Upon application of a voltage above the threshold voltage to gate conductive material 108B, a portion of body region 106B adjacent the gate insulation 103B is inverted to form a channel region 107B which allows a source region adjacent the channel region to be electrically connected to the drain below the body region 106B. The channel length control is typically from the surface of the mesa. Specifically, after formation of the trenches, the body region is formed by implanting into the mesa followed by diffusion. This process is repeated for forming the source region. The channel length is determined by the difference between the body region and source region referenced to the surface of the mesa.

The gate length of the trench MOSFET structure is determined by the difference in trench depth and the recess of the gate conductive material in the trench. If the recessed portion is too deep, it would have weak overlap between the gate electrode and source region. In addition, the body region can pinch off at the bottom of the trench when the trench is shallower in depth comparable to the body region. As a result, it would have a weak overlap between the gate and drain and as well as a higher $R_{dson}$ (i.e., On-resistance). To avoid the above issues, a deep source region and a deep trench are required. A deep source region requires a deeper body region. However, it would be difficult to have a short channel length with a deep body and source regions.

Thus, there is a need for providing a trench MOSFET with a controllable short channel length. It is within this context that aspects of the present disclosure arise.

DESCRIPTION OF THE SPECIFIC EMBODIMENTS

Figure 1A:
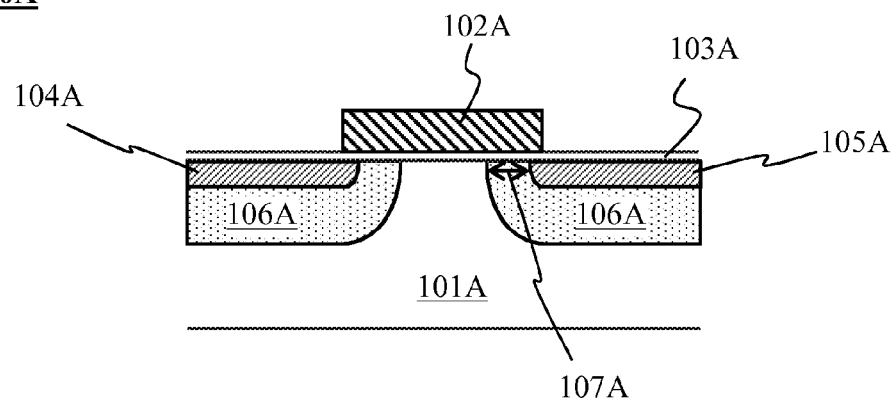
FIGS. 1A and 1B are cross sectional views showing conventional Power MOSFETs.
Figure 1B:
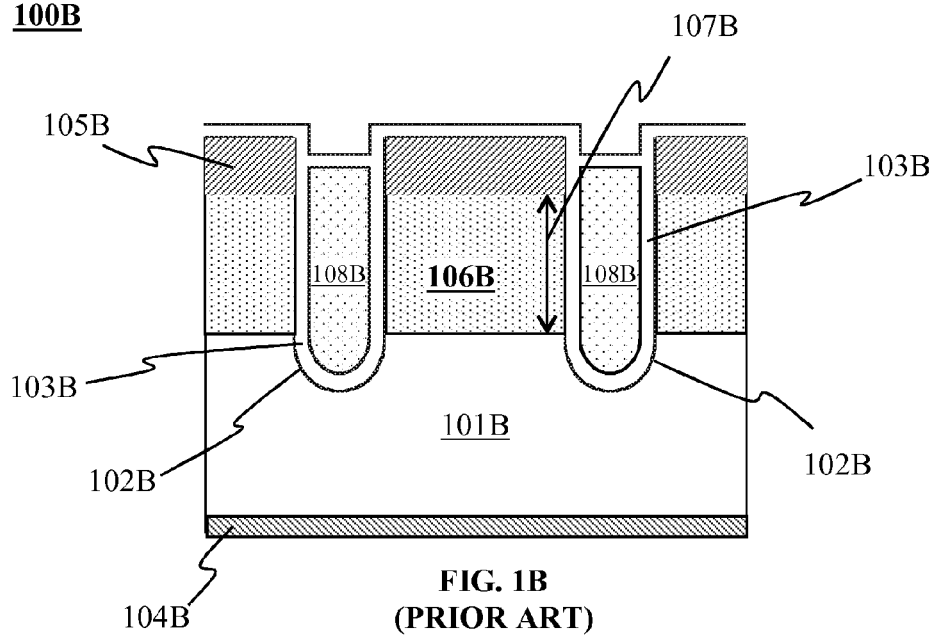

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

In the following detailed description, reference is made to the accompanying drawings, which form a part hereof, and in which is shown by way of illustration specific embodiments in which the invention may be practiced. In this regard, directional terminology, such as "top," "bottom," "front," "back," "first," "second," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. that are within the recited limits.

In the following discussion, the first conductivity type is typically N and the second conductivity type is P. However, it should be noted that substantially similar devices may be fabricated using a similar process but with conductivity types opposite those shown and described. Specifically, aspects of the present disclosure include implementations like those shown and described herein in which P is substituted for N and vice versa.

As known in the art, ion implantation is introduction of ionized dopant atoms into a target with enough energy to penetrate beyond the surface. An individual implanted ion undergoes scattering events with electrons and atoms in the target, reducing the ion's energy until it comes to rest. The total path length of the ion is called the range, R. The depth distribution or profile of stopped ions can be approximated by a Gaussian distribution function. The average distance a group of implanted ions travel into the surface is called the projected range. The standard deviation of the ion distribution range is called the straggle which includes a vertical and lateral straggle. The lateral straggle is the motion of ions perpendicular to the direction of the ion beam of the ion implantation. It is known that a lateral implant straggle depends on implant energy and ion species.

According to embodiments of the present disclosure, the channel length of a trench MOSFET may be controlled by counter-doping the body region with ions to form a lateral straggle region adjacent to the trenches, followed by ion-implanting the source region using a large angle tilt implantation. As such, the channel length is defined between the straggle region at the bottom and the source region at the top. The straggle region and the source region are of the same conductivity type but they may be different ion species.

According to one aspect of the present disclosure, a method for forming a trench MOSFET comprises providing a substrate of a first conductivity type semiconductor material, forming one or more trenches extending vertically into the substrate, forming a body region of a second conductivity type in an upper portion of the substrate between two neighboring trenches, forming a straggle region of the first conductivity type near a junction between the body region and an underlying portion of the substrate adjacent to the sidewalls of the one or more trenches, and forming a source region of the first conductivity type above the body region. The channel of the MOSFET is formed between the straggle region and the source region.

According to one aspect of the present disclosure, a trench MOSFET comprises a substrate of a first conductivity type semiconductor material, one or more trenches extending vertically into the substrate, a body region of a second conductivity type formed in an upper portion of the substrate between two neighboring trenches, a straggle region of the first conductivity type near a junction between the body region and an underlying portion of the substrate adjacent to the sidewalls of the one or more trenches, and a source region of the first conductivity type provided above the body region. The MOSFET channel is formed between the straggle region and the source region. The junction between the body region and the underlying portion of the substrate adjacent to the trench sidewalls may be shallower than the depth of the body-drain junction in between two adjacent trenches.

Figure 2:
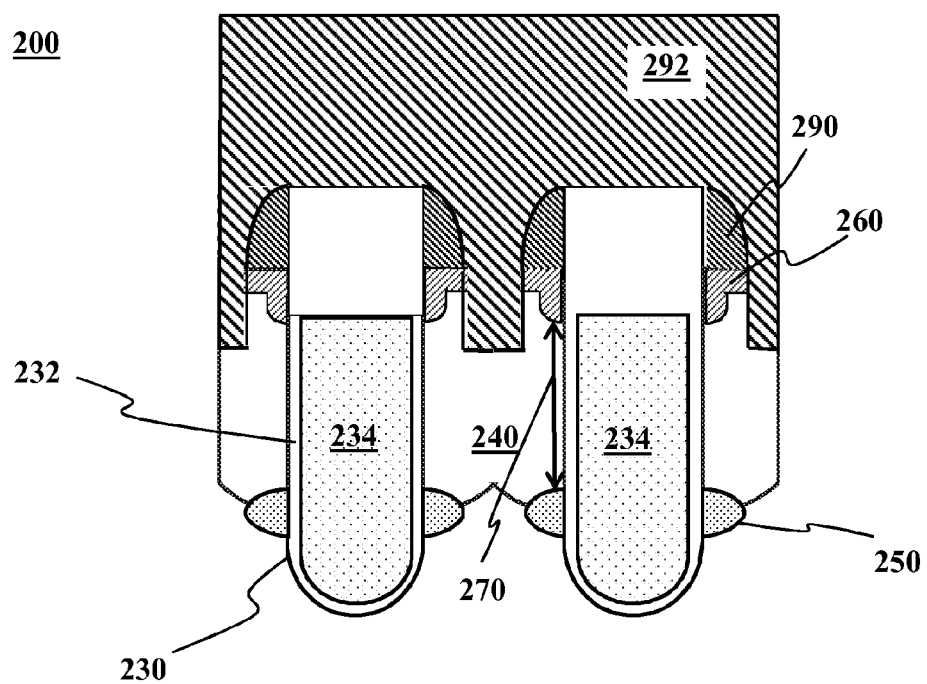
FIG. 2 is a cross-sectional view of a trench MOSFET device according to an aspect of the present disclosure.

Specifically, FIG. 2 is a cross sectional view of a trench MOSFET device according to one aspect of the present disclosure. The trench MOSFET device 200 has a substrate 210 that is a first conductivity type semiconductor material, e.g., an N-type substrate. The substrate 210 may include an upper portion of the first conductivity type semiconductor material (e.g., an N-epitaxial layer) as an epitaxial layer, and a lower portion with lower resistivity of the first conductivity type as a drain region. The doping concentration of the upper portion (i.e., the epitaxial layer) is lower than that of the lower portion of the substrate 210. In one example, the upper portion of the substrate 210 may be doped with Phosphorous in a concentration ranging from $2e14/cm^3$ to $5e16/cm^3$. Alternative species to Phosphorous include Arsenic. The trench MOSFET device 200 of FIG. 2 includes a plurality of trenches 230 extending vertically in the substrate 210. Each trench 230 is provided with a gate insulator 232 (e.g., gate oxide) on the sidewalls and the bottom of the trench, and completely filled with polysilicon 234. Specifically, the trench 230 may be formed by a combination of an isotropic etch and an anisotropic etch. The trench 230 may be etched vertically to a depth approximately in a range from about 0.6 to about 6 microns. The thickness of the gate insulator 232 around the trench 230 may range from about 10 to about 200 nanometers to provide sufficient electrical shielding.

The trench MOSFET device 200 of FIG. 2 further includes a body region of the second conductivity type (e.g., P body) 240 provided over the substrate 210 and between every two gate trenches 230. The P body region 240 may be formed by doping with P type dopants in upper portion of the substrate 210 by large angle tilt implantation at about 7 to about 45 degree tilt angle perpendicular to the trench. After implantation, the implants in the body region may be diffused to form a body region to a depth of about 0.5 to about 1.5 microns. In one embodiment, the P body region 240 may be formed by implanting Boron at about 80 keV with a total dose of about $5e12/cm^3$ to about $1e14/cm^3$. In other embodiments, Phosphorous may be used for N-type doping (in the case of a P-type substrate).

A straggle region of first conductivity type 250 is provided adjacent to the trenches 230 at a junction between the body region 240 and an underlying portion of the substrate 210. The straggle region 250 compensates the body implant to define the bottom of the MOSFET channel. That is, a dopant of a conductivity type opposite to that of the body region 240 is used to form the straggle region. Specifically, the straggle region 250 may be formed by counter doping the body region at the body-drain junction (i.e., the junction between the body region and the substrate) by lateral straggle implantation with an N-type dopant. Selection of dopant and implant energy depends on how deep the straggle region is desired to form. In one embodiment, Phosphorous atoms may be used as a dopant with a dose of 1e13/cm$^3$ to about 5e14/cm$^3$ to form the straggle region at a depth of about 0.5 to about 1.2 microns with implantation energy ranging from about 400 to about 1500 KeV. Phosphorous atoms have higher implant project range and lateral straggle. Thus, doping with Phosphorous may achieve deeper implant and lateral diffusion as desired. It should be noted that the ion species employed in forming the straggle region 250 may be different from that in forming the substrate 210 and source region 260. It should be also noted that the formation of the straggle region 250 may be performed before the trench 230 is etched or after the trench is formed and filled with polysilicon.

A source region 260 of the first conductivity type (e.g., an N-type source region) is provided over the P body region 240 near the top surface of the semiconductor substrate. In one embodiment, a large angle tilt implantation may be performed on the body region 240 through a window between masks 290 to form the source region. The implantation uses an n-type dopant that may be tilted in its orientation and adjusted as desired. In one example, the source region 260 may be formed using Arsenic at an implantation energy ranging from about 40 to about 100 KeV and a tilt angle of about 15 to about 45 degrees perpendicular to the trench. The Arsenic implant has a dose of about 5e14/cm$^3$ to about 5e15/cm$^3$. Arsenic atoms are heavier (i.e., large atomic mass) and thus they have lower diffusivity. That is, doping with Arsenic may result in a shallow implant and less vertical or lateral diffusion. The trench MOSFET device 200 also includes a source and body contact metal 292.

Figure 3A:
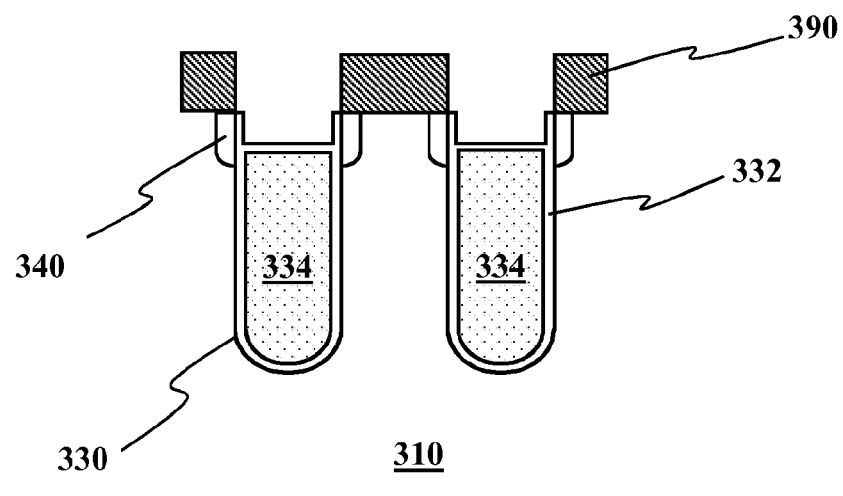
FIGS. 3A-3D are cross sectional views illustrating a process of forming a trench MOSFET device according to an aspect of the present disclosure.
Figure 3B:
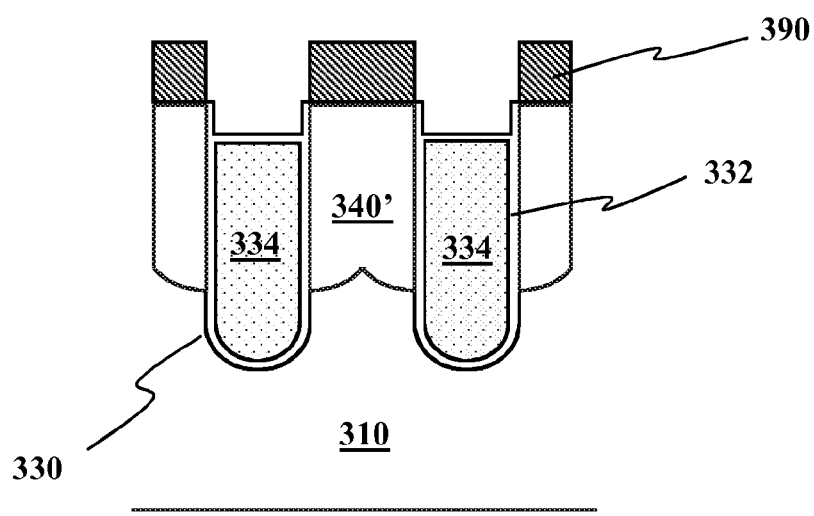
Figure 3C:
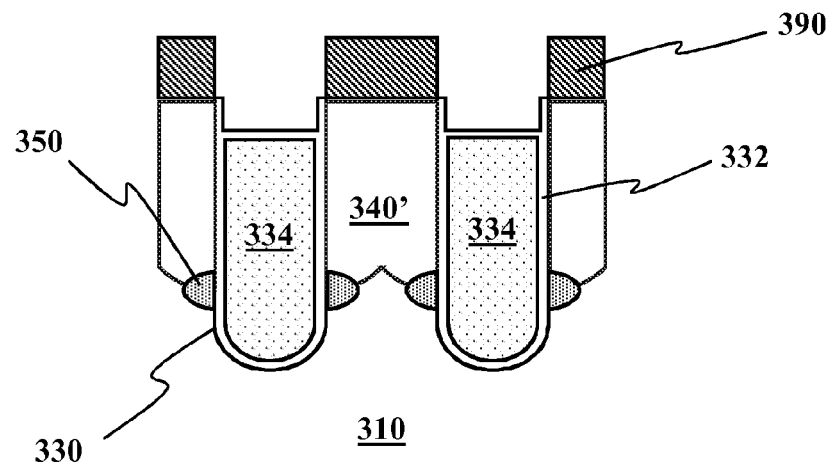
Figure 3D:
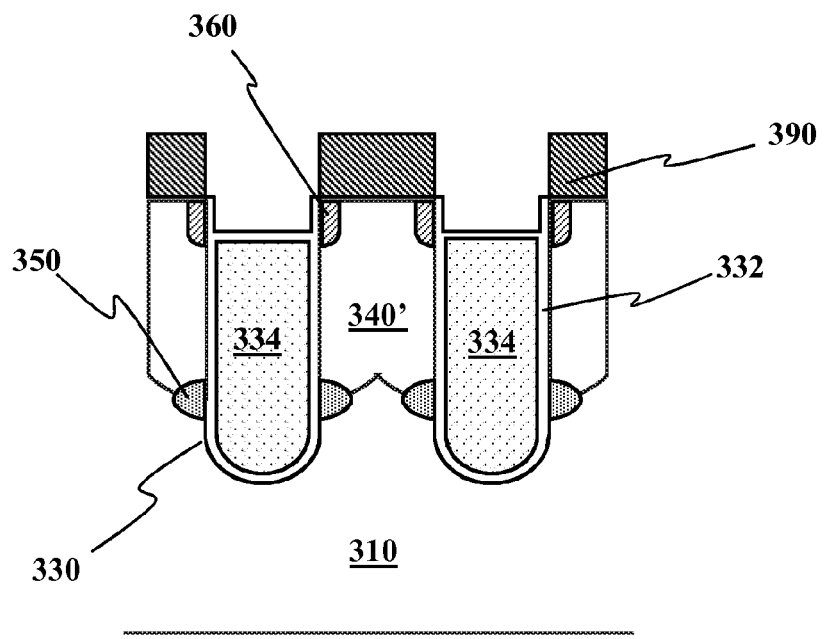

FIGS. 3A-3D are cross sectional views illustrating an example of a possible method of forming the trench MOSFET device according to an aspect of the present disclosure. FIG. 3A shows N type substrate 310, trench 330 lined with gate insulator and filled with polysilicon 334, and a hard mask 390. In one embodiment, these structures may be formed in the initial stages of the fabrication of the trench MOSFET. With the N type substrate 310 and a mask 390 provided above the substrate 310, the trench 330 may be formed in the substrate by at least partially by an isotropic etch. A gate oxidation process is performed to form a gate insulator 332 on the vertical sidewalls and the bottom of the trench. Each trench is then at least partially filled with gate electrode material, such as doped polysilicon. With a gate trench formed, a large angle tilt implantation may be performed to form implants 340 with a different conductivity type dopant (e.g., P type) from that in the substrate (e.g., N type). After diffusion of the P-type implants 340, a P-type body region 340' is formed as shown in FIG. 3B. In FIG. 3C, a straggle region 350 is formed at the body-drain junction through lateral straggle implantation. Specifically, the body is counter-doped with a different conductivity type dopant (e.g., N type) from that in the body region 340' (e.g., P type). The N-type straggle region 350 serves to define the bottom of the MOSFET channel. In an alternative embodiment, the N-type straggle region 350 may be form at the desired depth in the substrate before forming the trench 330. After formation of the straggle region 350, a large angle tilt implantation is performed to form N-type source regions 360. The bottom of the source region 360 defines the top of the MOSFET channel. An additional source implant may be needed after the hard mask removal to connect the source regions 360 together. After formation of contact trenches, a trench MOSFET structure of FIG. 2 is formed.

Figure 4A:
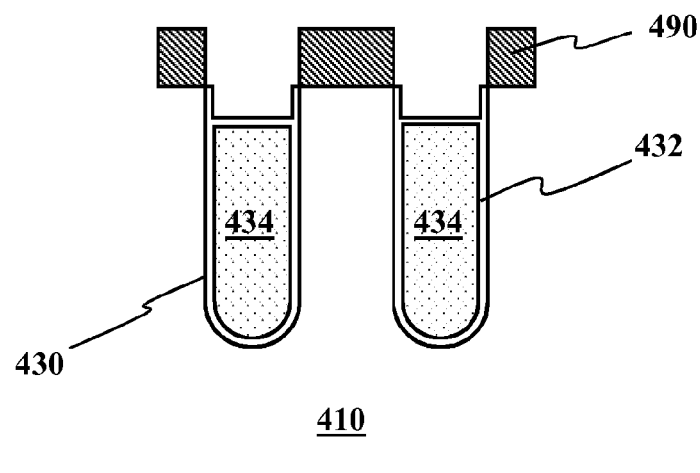
FIGS. 4A-4G are cross sectional views illustrating a process of forming a trench MOSFET device according to an aspect of the present disclosure.
Figure 4B:
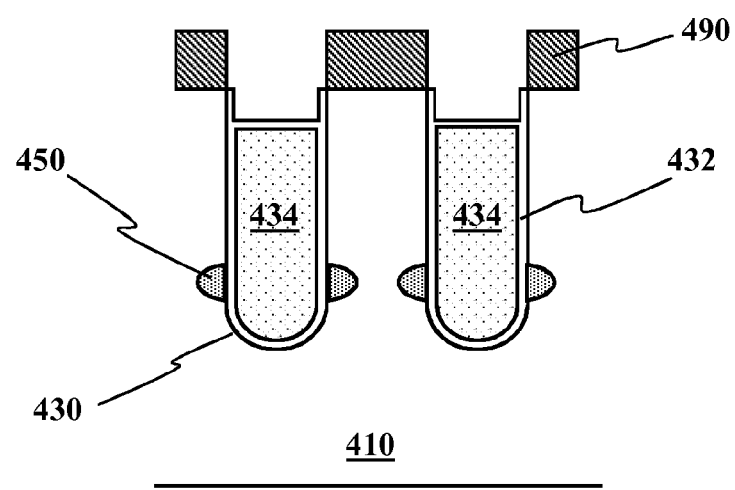
Figure 4C:
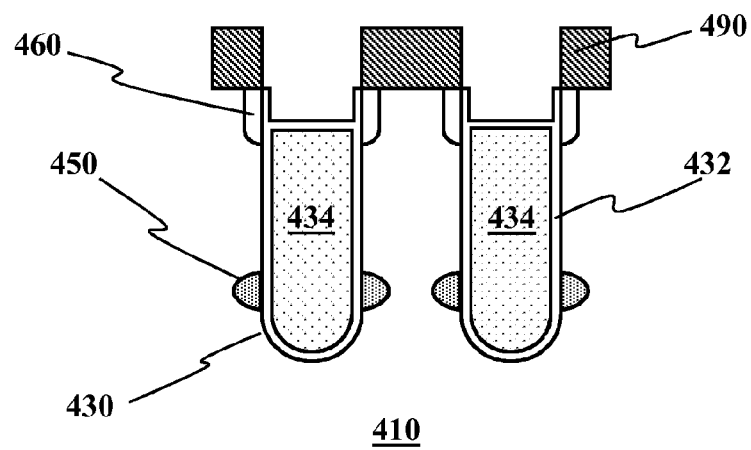
Figure 4D:
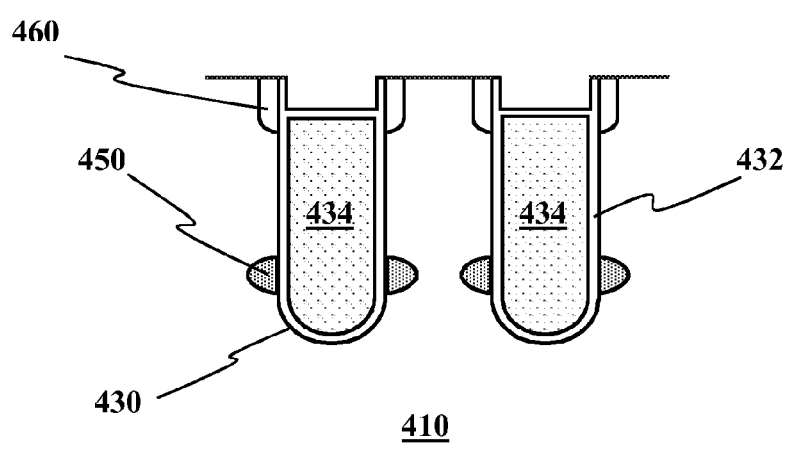
Figure 4E:
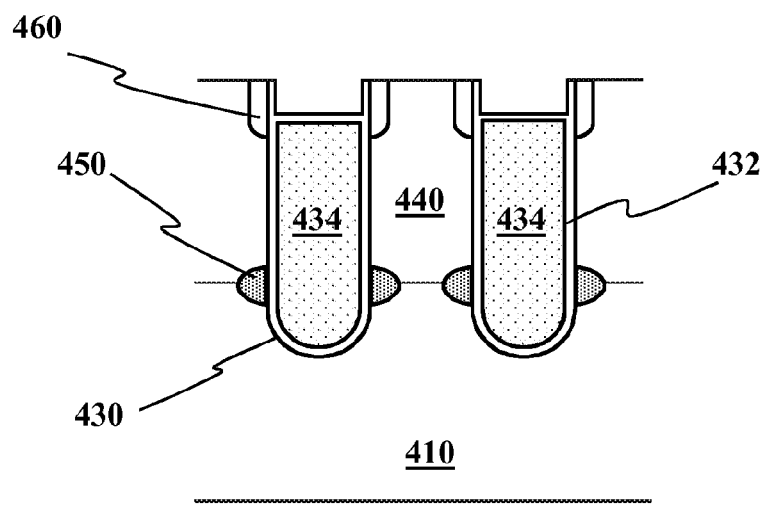
Figure 4F:
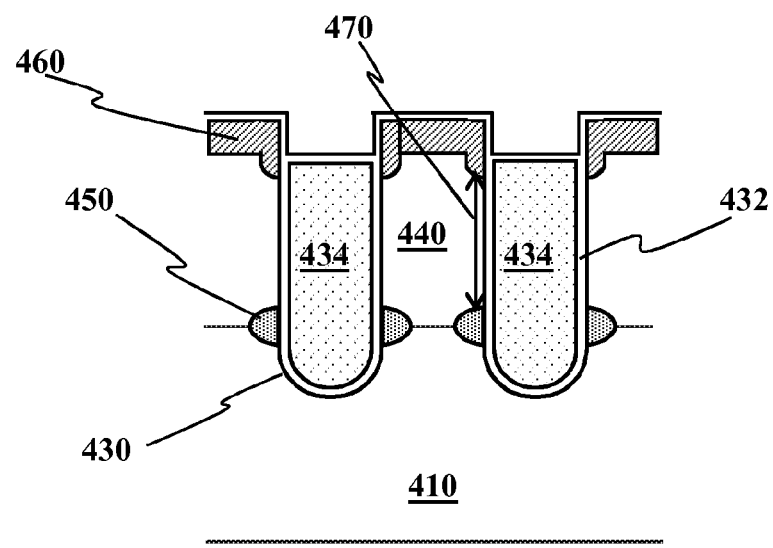
Figure 4G:
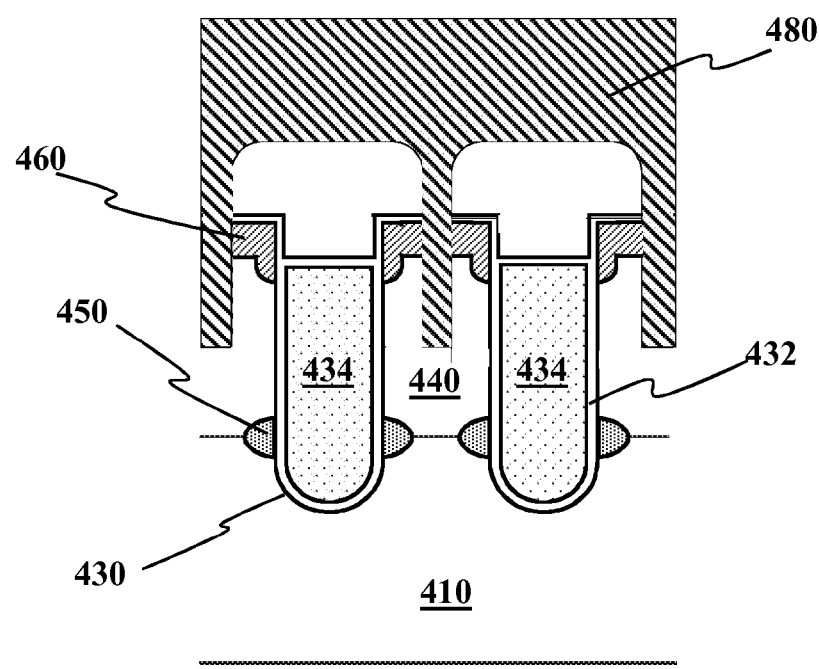

FIGS. 4A-4G are cross sectional views illustrating an example of a possible method of forming the trench MOSFET device according to an aspect of the present disclosure. FIG. 4A shows N-type substrate 410, trench 430 lined with gate insulator and filled with polysilicon 434, and a hard mask 490. In one embodiment, after forming the structures of FIG. 4A, an N-type straggle region 450 may be formed near the bottom of the trenches as shown at FIG. 4B through lateral straggle implantation. In an alternative embodiment, the straggle region 450 may be formed at the desired depth in the substrate before forming the trench 430. FIG. 4C shows N-type source regions 460 are formed by a large angle tilt implantation. The mask 490 is removed as shown in FIG. 4D after the source regions are formed. At FIG. 4E, a P-type body region 440 is formed. In one example, the P body region 440 may be formed by doping with P type dopants in upper portion of the substrate 410 through a high energy ion implantation followed by an annealing process. At FIG. 4F, another implantation is performed near the surface of the body region, such as N-type ion implantation, to connect source regions 460. In one embodiment, when the mesa is narrow enough, e.g., between about 0.2 and about 0.5 microns, a diffusion process or high energy large angle tilt implantation of Arsenic ions may be sufficient to connect the source regions 460. After formation of contact trenches and metallization, a metal contact 480 is formed to electrically connect the source and body regions as shown in FIG. 4G.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A method for forming a trench MOSFET, comprising:
   forming one or more trenches extending vertically into a substrate of a first conductivity type semiconductor material, wherein each of the one or more trenches is provided with a gate insulator on each sidewall and filled with a conductive material with the gate insulator between the conductive material and the sidewalls of the one or more trenches;
   forming a body region of a second conductivity type between two neighboring trenches at an upper portion of the trenches;
   forming a straggle region of the first conductivity type adjacent to the sidewalls of the one or more trenches, the straggle region counter-dopes the body region to form a junction between the body and the drain at the sidewalls of the trenches, wherein a depth of the junction at a location adjacent to the sidewalls of the one or more trenches is shallower in depth compared to that of the junction at a location between two adjacent trenches; and
   forming a source region of the first conductivity type above the body region, wherein a channel of the MOSFET is defined by the straggle region and the source region.

2. The method of claim 1, wherein the straggle region is doped with different dopants than dopants used in the source region.

3. The method of claim 1, wherein the straggle region is doped with Phosphorous atoms.

4. The method of claim 1, wherein the source region is doped with Arsenic atoms.

5. The method of claim 1, wherein the straggle region is formed with an implantation energy of between about 400 and about 1200 KeV.

6. The method of claim 1, wherein the straggle region is formed by lateral straggle implantation through a mask with a first conductivity type dopant.

7. The method of claim 1, wherein the body region is formed by ion implantation at about a tilt angle of about 0 to about 45 degrees perpendicular to the trench and diffusion.

8. The method of claim 1, wherein the source region is formed by ion implantation at a tilt angle of about 0 to about 45 degrees perpendicular to the trench.

9. The method of claim 1, wherein the straggle region is formed before or after forming the one or more trenches.

10. The method for claim 1, wherein the straggle region is formed before or after forming the body region.

11. The method of claim 1, wherein the source region is formed before or after forming the body region.

12. The method of claim 1, further comprising connecting the source region to one another by an ion implantation of the first conductivity type, diffusion or high energy large angle tilt implantation.

13. The method of claim 1, further comprising forming a contact to electrically connect the body and the source regions.

14. The method of claim 1, wherein the first conductivity type is N and the second conductivity type is P.

15. A trench MOSFET, comprising:
a substrate of a first conductivity type semiconductor material;
one or more trenches extending vertically into the substrate, each of the one or more trenches being provided with a gate insulator on each sidewall and filled with a conductive material;
a body region of a second conductivity type formed in an upper portion of the substrate between two neighboring trenches and over the substrate;
a straggle region of the first conductivity type at a depth substantially near a junction between the body region and an underlying portion of the substrate adjacent to one or more sidewalls of the one or more trenches, wherein a depth of the junction at a location adjacent to the sidewalls of the one or more trenches is shallower in depth compared to that of the junction at a location between two adjacent trenches; and
a source region of the first conductivity type provided above the body region, wherein a channel of the MOSFET is defined by the straggle region and the source region.

16. The trench MOSFET of claim 15, wherein the straggle region is doped with different dopants than dopants used in the source region.

17. The trench MOSFET of claim 15, wherein the straggle region is doped with Phosphorous atoms.

18. The trench MOSFET of claim 15, wherein the source region is doped with Arsenic atoms.

19. The trench MOSFET of claim 15, wherein the first conductivity type is N and the second conductivity type is P.

20. The trench MOSFET of claim 15, wherein the first conductivity type is P and the second conductivity type is N.

* * * * *